(12) United States Patent
Satakopan et al.

(10) Patent No.: US 7,032,200 B1
(45) Date of Patent: Apr. 18, 2006

(54) LOW THRESHOLD VOLTAGE TRANSISTOR DISPLACEMENT IN A SEMICONDUCTOR DEVICE

(75) Inventors: Sriram Satakopan, Sunnyvale, CA (US); Arvindvel Shanmugavel, Mountain View, CA (US); Shunjiang Xu, Sunnyvale, CA (US); Von-Kyoung Kim, Santa Clara, CA (US); Peter Lai, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 260 days.

(21) Appl. No.: 10/657,964

(22) Filed: Sep. 9, 2003

(51) Int. Cl.
*G06F 17/50* (2006.01)

(52) U.S. Cl. .................... 716/6; 716/4; 716/5
(58) Field of Classification Search ............... 716/4–6
See application file for complete search history.

(56) References Cited

U.S. PATENT DOCUMENTS

| | | | |
|---|---|---|---|
| 5,774,367 A | 6/1998 | Reyes et al. | |
| 6,087,886 A | 7/2000 | Ko | |
| 6,107,834 A | 8/2000 | Dai et al. | |
| 6,396,749 B1 | 5/2002 | Al-Shamma et al. | |
| 6,687,888 B1* | 2/2004 | Chen ............... | 716/5 |
| 6,708,312 B1* | 3/2004 | Chiang et al. ........ | 716/1 |
| 6,711,720 B1* | 3/2004 | Chen ............... | 716/2 |
| 6,745,371 B1* | 6/2004 | Konstadinidis et al. ..... | 716/2 |
| 2002/0099989 A1 | 7/2002 | Kawabe et al. | |
| 2002/0144223 A1 | 10/2002 | Usami et al. | |
| 2004/0230924 A1* | 11/2004 | Williams et al. ......... | 716/2 |

OTHER PUBLICATIONS

Elrabaa et al., "*A Contention-Free Domino Logic for Scaled-Down CMOS Technologies with Ultra Low Threshold Voltages*," IEEE International Symposium on Circuits and Systems, May 28-31, 2000, pp. 1-748 through 1-751.

Fujii et al., "*A Sub-IV Dual-Threshold Domino Circuit Using Product-of-Sum Logic*," International Symposium on Low Power Electronics and Design, Aug. 2001, pp. 259-262.

Kao et al., "*Dual-Threshold Voltage Techniques for Low-Power Digital Circuits*," IEEE Journal of Solid-State Circuits, vol. 35, No. 7, Jul. 2000, pp. 1009-1018.

(Continued)

*Primary Examiner*—Matthew W. Smith
*Assistant Examiner*—Naum B. Levin
(74) *Attorney, Agent, or Firm*—Zagorin O'Brien Graham LLP

(57) ABSTRACT

A technique improves the performance of an integrated circuit design by selectively replacing low $V_t$ transistors with standard $V_t$ transistors. The selection of gates for replacement may be based on a multi-path timing analysis. If a low $V_t$ variant of a gate instance increases a path cycle time as compared to a standard $V_t$ counterpart, the maximum of the path cycle times for all paths that include the low $V_t$ variant and the maximum of the path cycle time for these paths with a standard $V_t$ variant are calculated. If the maximum path cycle time for the path including the low $V_t$ variant is greater than the maximum path cycle time for the path including the standard $V_t$ variant, then that low $V_t$ variant is substituted with a standard $V_t$ variant. Thus, integrated circuit designs prepared in accordance with the invention may exhibit improved cycle times.

23 Claims, 2 Drawing Sheets

OTHER PUBLICATIONS

McPherson et al., "*760 MHz G6 S/390 Microprocessor Exploiting Multiple Vt and Copper Interconnects*," IEEE, ISSCC, Feb. 7, 2000, pp. 96-97.

Miyake et al., "*Design Methodology of High Performance Microprocessor using Ultra-Low Threshold Voltage CMOS,*" IEEE Custom Integrated Circuits Conference, May 6-9, 2001, pp. 275-278.

Mutoh et al., "*A 1-V Multithreshold-Voltage CMOS Digital Signal Processor for Mobile Phone Application,*" IEEE Journal of Solid-State Circuits, vol. 31, No. 11, Nov. 1996, pp. 1795-1802.

Shibata et al., "*A 1-V, 10-MHz 3.5-mW,1-Mb MTCMOS SRAM with Charge-Recycling Input/Output Buffers,*" IEEE Journal of Solid-State Circuits, vol. 34, No. 6, Jun. 1999, pp. 866-877.

Takamiya et al., "*High Drive-Current Electrically Induced Body Dynamic Threshold SOI MOSFET (EIB-DTMOS) with Large Body Effect and Low Threshold Voltage,*" IEEE Transactions on Electron Devices, vol. 48, No. 8, Aug. 2001, pp. 1633-1640.

Tripathi et al., "*Optimal Assignment of High Threshold Voltage for Synthesizing Dual Threshold CMOS Circuits,*" IEEE, Jan. 7, 2001, pp. 227-232.

* cited by examiner

LOW THRESHOLD VOLTAGE TRANSISTOR DISPLACEMENT IN A SEMICONDUCTOR DEVICE

BACKGROUND

1. Field of the Invention

The present invention relates generally to techniques for designing and optimizing semiconductor devices and, in particular, to automated techniques for substituting low threshold voltage transistor, gate, or cell instances in a semiconductor design.

2. Description of the Related Art

Integrated circuit designers may replace standard threshold voltage ($V_t$) transistors with low $V_t$ transistors in critical circuit paths to increase clock speeds of high-speed circuits while meeting semiconductor device process limitations. In general, low $V_t$ transistors have a reduced intrinsic delay as compared to corresponding standard $V_t$ cells. As a result, use of a low $V_t$ cell instance in substitution for a cell instance that contributes to a maximum time violation in a timing path may allow an integrated circuit design to operate at a higher frequency. However, under some circumstances, low $V_t$ cells may exhibit increased intrinsic delays as compared to standard $V_t$ cells. For example, devices manufactured using one process technology may exhibit an increase in the intrinsic delay of a low $V_t$ cell as compared to a standard $V_t$ counterpart for falling edge transitions at the inputs of higher fan-in cells. Accordingly, there is a need for a technique that identifies these low $V_t$ cells that reduce performance as compared to standard $V_t$ cells, and selectively replaces these low $V_t$ cells with standard $V_t$ cells to improve circuit performance.

SUMMARY

A mechanism has been developed by which the performance of an integrated circuit design can be improved by selectively replacing low $V_t$ transistors with standard $V_t$ transistors. In some embodiments of the invention, the selection of gates for replacement is based on a multi-path timing analysis. This timing analysis may include information on path cycle time, device type, and input slew rates for each device in the path. The input slew rates may include information on falling edge input transitions, in addition to rising edge transitions. This timing analysis may be performed for every path that includes a low $V_t$ variant of a gate instance.

In some embodiments of the invention, if a low $V_t$ variant of a gate instance increases a path cycle time as compared to a standard $V_t$ counterpart, the maximum of the path cycle times for all paths that include the low $V_t$ variant is calculated. A maximum of the path cycle times for these paths with a standard $V_t$ variant substituted for the low $V_t$ variant is also calculated. In some embodiments, the selection mechanism compares these two maximum cycle times. If the maximum path cycle time for the path including the low $V_t$ variant is greater than the maximum path cycle time for the path including the standard $V_t$ variant, then that low $V_t$ variant is substituted with a standard $V_t$ variant. As a result, integrated circuit designs prepared in accordance with the present invention may exhibit substantial cycle time improvements.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION OF THE INVENTION

The developed substitution techniques are, in general, applicable at a variety of levels of design hierarchy, such as at the individual device, transistor, or FET gate level, at the logic gate or standard cell level, or at larger circuit block levels. In each case, a standard $V_t$ instance may be selectively substituted for a low $V_t$ instance. The low $V_t$ variants may have been replacements for standard $V_t$ gate instances in critical circuit paths. For example, one suitable mechanism for low $V_t$ transistor substitution in an integrated circuit is described in detail in commonly-owned, co-pending U.S. patent application Ser. No. 10/098,756, entitled "LOW $V_t$ TRANSISTOR SUBSTITUTION IN A SEMICONDUCTOR DEVICE," the entirety of which is incorporated herein by reference. Persons of ordinary skill in the art will appreciate that a low $V_t$ logic gate instance or circuit block may, in general, include one or more low $V_t$ devices or transistors. Selective substitution may be made at any level of design hierarchy appropriate to a particular integrated circuit design and/or design environment. For purposes of clarity, much of the description that follows is expressed in the context of instances of standard cells that implement logic gates. Accordingly, in some realizations, particular gate instances and low $V_t$ gate instances may correspond to instances of standard cells and timing analyses, and substitutions will be performed at levels of hierarchy corresponding to such instances and networks thereof. However, more generally, the terminology "gate instance" and "low $V_t$ gate instance" will be understood to include instances of integrated circuit structures and features ranging from individual instances of devices, transistors or gates, to individual instances of logic gates or flops, to instances of circuit blocks. Of course, not all transistors or other devices of a low $V_t$ logic gate or circuit block need be low $V_t$ transistors or devices and suitable designs, including standard cell designs, for low $V_t$ logic gates or circuit blocks will be understood by persons of ordinary skill in the art.

In view of the foregoing, and without limitation, aspects of an exemplary exploitation of the developed techniques are now described in the context of networks of standard cell logic gate instances, timing analysis thereof, and substitutions of low $V_t$ variants with standard $V_t$ variants of the standard cells. Based on the description herein, persons of ordinary skill in the art will appreciate suitable exploitations for gate instances at a variety of levels of design hierarchy.

Figure 1:
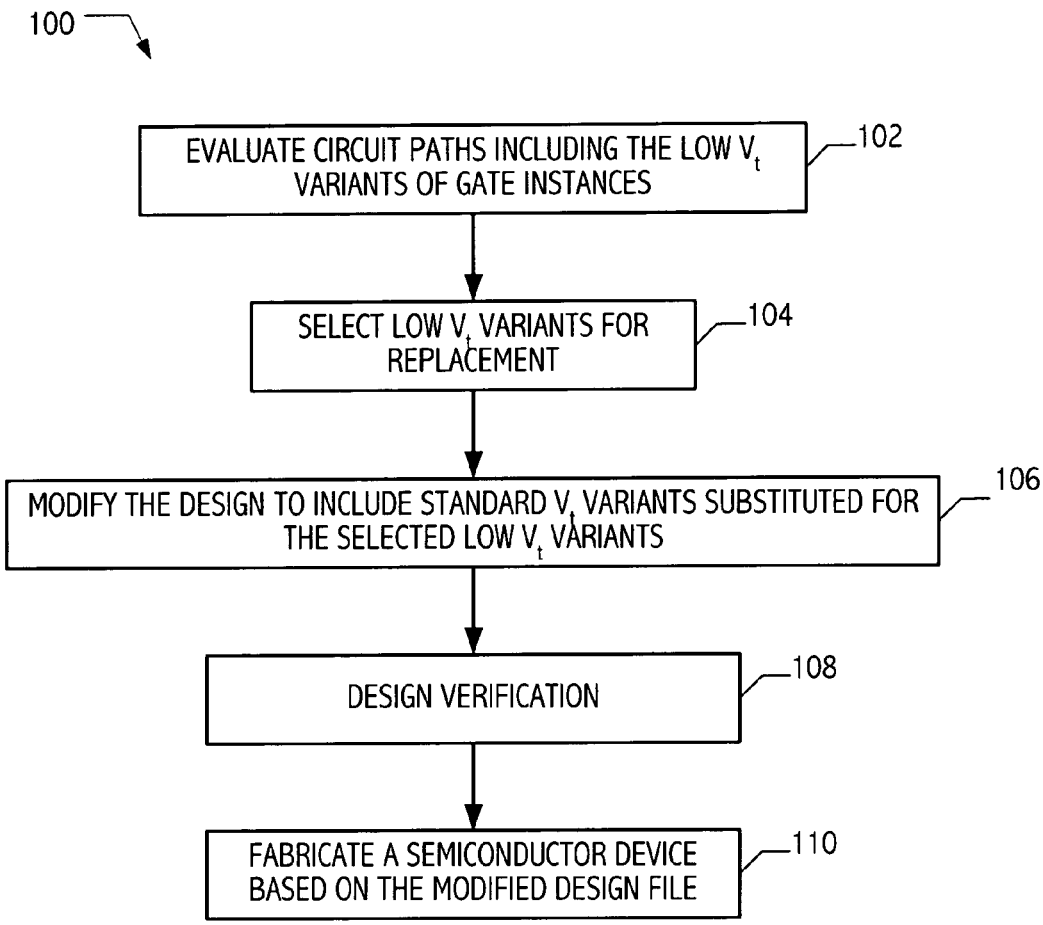
FIG. 1 depicts information and control flows for a technique for processing a design for a semiconductor device in accordance with some embodiments of the present invention.

Referring to FIG. 1, a method of processing a design for a semiconductor device is illustrated. The method includes evaluating circuit timing paths in a design file including the low threshold voltage ($V_t$) variants of gate instances (102). Low $V_t$ variants are selected for replacement (104). Next, the design is modified to include standard $V_t$ variants substituted for the selected low $V_t$ variants (106). This may be achieved by swapping information corresponding to the low $V_t$ physical files, low $V_t$ schematic representations, and low $V_t$ timing files with those for the respective standard $V_t$ cells. In a particular implementation, two substantially co-extensive cell libraries may be provided. For example, a standard $V_t$ library may be provided that includes standard $V_t$ type transistors, circuit and gate configurations implementing cells of the library, while a low $V_t$ library includes low $V_t$ type transistors and circuit and gate configurations implementing corresponding cells. In such an implementation, swapping a particular cell instance from low $V_t$ to standard $V_t$ simply involves substituting information for a corresponding cell from a different library. After the selected cells of the design have been substituted from low $V_t$ to standard $V_t$ cells, design verification tests, such as noise tests, minimum timing tests, and physical verification tests, may be re-executed (108) to verify the new design that includes the substituted low $V_t$ cells. The design file may then be used to fabricate a semiconductor chip (110) according to any procedure for manufacturing a semiconductor chip known in the art.

Figure 2:
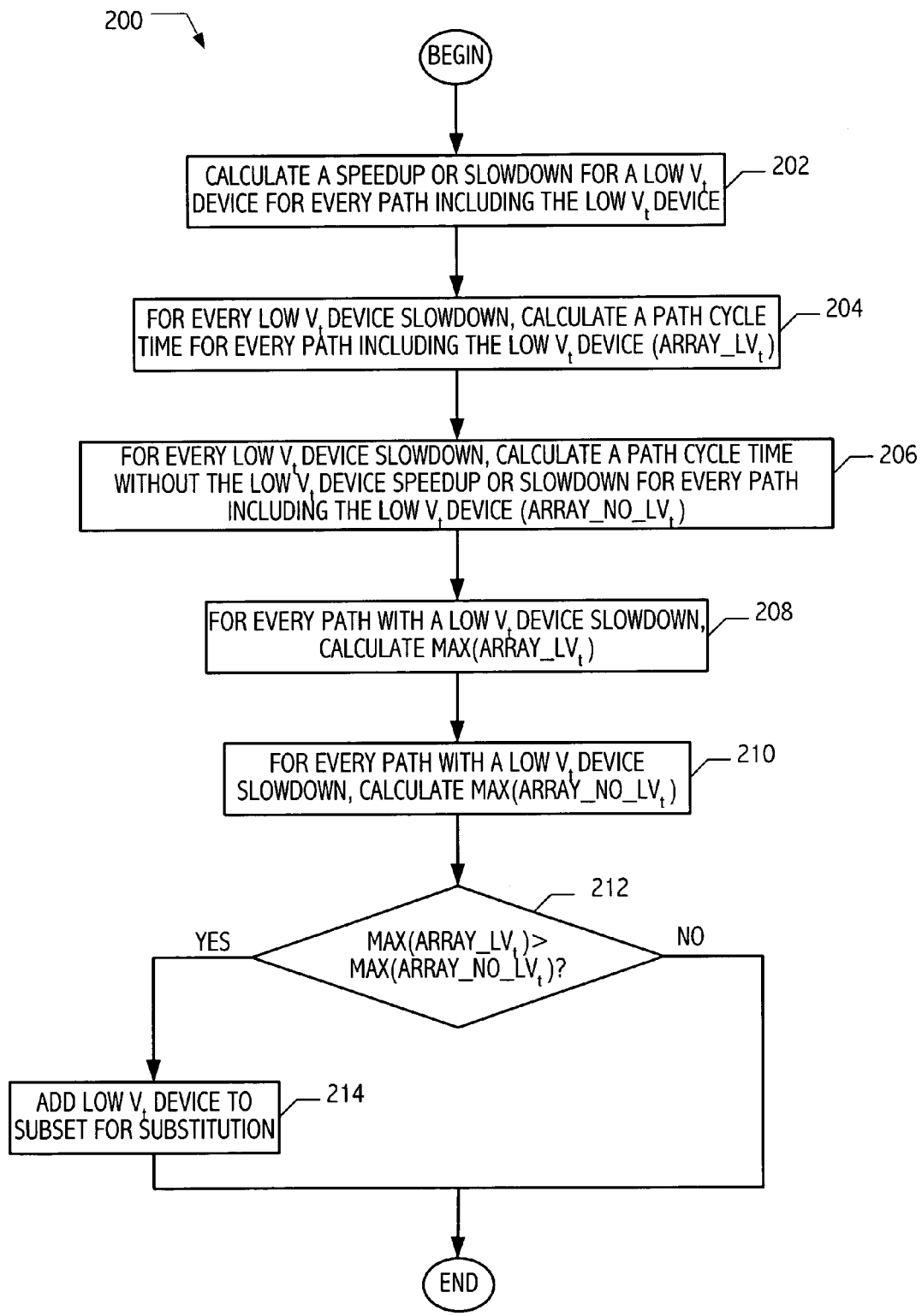
FIG. 2 depicts information and control flows for a technique for processing design files.

A method for selecting low $V_t$ variants for replacement is illustrated in FIG. 2. This method generates a maximum timing report for a design including only standard $V_t$ devices and a maximum timing report for the same design including at least one low $V_t$ device. These timing reports may include information about path cycle times, device delays, device type, and slew rate for rising and falling edge transitions of the signal at each node. Each instance of a low $V_t$ device may reside in multiple paths. The method compares the gate delays of the low $V_t$ device and its corresponding standard $V_t$ counterpart for a path including the low $V_t$ device (202). In one realization, if the cycle time for the path including the low $V_t$ device is shorter than the cycle time for the path including only standard $V_t$ devices, then that low $V_t$ device produces a "speedup." If the cycle time for the path including the low $V_t$ device is longer than the cycle time for the path including only standard $V_t$ devices, then that low $V_t$ device produces a "slowdown," or timing penalty.

For each path including a low $V_t$ device that produces a slowdown, the method then computes a path cycle time for every path including that low $V_t$ device (204) and a path cycle time for those same paths but with a standard $V_t$ device substituted for the low $V_t$ device (206). For each low $V_t$ device that produces a slowdown for any path, the method computes the maximum of the path cycle times for each path including the low $V_t$ device (208) and the maximum of the path cycle times for that path without the low $V_t$ device (210). If the maximum of the path cycle times for each path including the low $V_t$ device is less than or equal to the maximum of the path cycle times for that path without the low $V_t$ device, then that low $V_t$ device will not be replaced by a standard $V_t$ device (212). If the maximum of the path cycle times for each path including the low $V_t$ device exceeds the maximum of the path cycle times for that path without the low $V_t$ device by a threshold penalty, then that low $V_t$ device is selected for replacement with a standard $V_t$ device (214). In one embodiment, the threshold penalty is design-dependent and equals one picosecond for an exemplary 130 nm process technology. The method does not replace a low $V_t$ device with a standard $V_t$ device when the maximum of the path cycle times for each path including the low $V_t$ device is equal to the maximum of the path cycle times for that path without the low $V_t$ device because a device that receives its inputs from a low $V_t$ device may have improved performance than a device that receives its inputs from a standard $V_t$ device.

Examples for steps 204–214 of the invention are illustrated for an exemplary circuit design in Tables 1 and 2. A low $V_t$ device is identified in steps 202–206 that produces a slowdown for at least one design path including this device. The device occurs in three design paths. For each of these paths, the path cycle time is computed for the path including the low $V_t$ device, and for the path without the low $V_t$ device speedup or slowdown. The maximum path cycle time with the low $V_t$ device is 300 ps. The maximum path cycle time for the path without the low $V_t$ device speedup or slowdown is 296 ps. Since the maximum path cycle time for the path without the low $V_t$ device is less than the maximum path cycle time for the path including the low $V_t$ device, the method selects this low $V_t$ device for replacement by a standard $V_t$ device.

TABLE 1

Example of method for a low $V_t$ device that occurs in three paths

| Path | Timing penalty | Effect of $LV_t$ on path cycle time | Path cycle time with $LV_t$ device | Path cycle time without $LV_t$ device penalty |
|---|---|---|---|---|
| 1 | −5 | Slowdown | 295 ps | 290 ps |
| 2 | +11 | Speedup | 285 ps | 296 ps |
| 3 | −7 | Slowdown | 300 ps | 293 ps |

However, if the slowdown in path 3 for this design is −2, as displayed in Table 2, the low $V_t$ device will not be selected for replacement. The maximum path cycle time with the low $V_t$ device is now 295 ps, which is less than the maximum path cycle time for the path without the low $V_t$ device speedup or slowdown of 296 ps. Although the low $V_t$ device produces a slowdown in two of three paths, this device is not replaced with a standard $V_t$ device because it provides an improvement in the maximum path cycle times.

TABLE 2

Example of method for a low $V_t$ device that occurs in three paths

| Path | Timing penalty | Effect of $LV_t$ on path cycle time | Path cycle time with $LV_t$ device | Path cycle time without $LV_t$ device penalty |
|---|---|---|---|---|
| 1 | −5 | Slowdown | 295 ps | 290 ps |
| 2 | +11 | Speedup | 285 ps | 296 ps |
| 3 | −2 | Slowdown | 295 ps | 293 ps |

A method consistent with the previous discussion may be embodied in an automated computer software semiconductor design tool for processing design files, which may be executed on a programmable computer. In one exemplary embodiment, software implemented as PERL scripts selects low $V_t$ variants for replacement by processing design files generated by Millennium Delay Calculator, available from Celestry Design Technologies, Inc., and PEARL Static Timing Analyzer, available from Cadence Design Systems, Inc. In addition, design tools that support VERILOG or other hardware description languages may be employed. Persons of ordinary skill in the art will recognize a variety of design tools and languages appropriate for implementing the teaching described herein. Other variations and modifications of the embodiments disclosed herein, may be made based on the description set forth herein, without departing from the scope and spirit of the invention as set forth in the following claims.

What is claimed is:

1. A method for use in connection with an integrated circuit design, the method comprising:
   determining timing differences for respective ones of a plurality of paths, an individual timing difference being between an individual path of the plurality of paths including a low threshold variant of a gate instance and the individual path including a standard threshold variant of the gate instance, the individual path including at least one low threshold variant of a gate instance;
   determining a first set of path cycle times for respective ones of at least a subset of the plurality of paths, the subset corresponding to individual paths of the plurality of paths, the individual paths including a particular low threshold variant of a gate instance, a timing difference corresponding to at least one of the individual paths of the subset being a slowdown;
   determining a second set of path cycle times for respective ones of the subset of the plurality of paths, the individual paths including a standard threshold variant corresponding to the particular low threshold variant, thereby removing the timing difference from the individual paths;
   selecting a subset of low threshold voltage variants of gate instances for substitution with respective standard threshold voltage variants thereof based on at least a maximum of the first set of path cycle times and a maximum of the second set of path cycle times for a corresponding low threshold voltage variant.

2. The method of claim 1, wherein the timing difference is based on at least an input slew rate of an individual gate instance in at least one individual circuit path.

3. The method of claim 2, wherein the input slew rate is based at least in part on a falling edge input transition.

4. The method of claim 1 wherein the timing difference exceeds a threshold.

5. The method of claim 1, further comprising substituting in the integrated circuit design, the selected low threshold voltage variants with the respective standard threshold voltage variants thereof.

6. The method of claim 5, further comprising fabricating an integrated circuit including the substituted standard threshold voltage gate instances.

7. The method of claim 1, further comprising preparing the integrated circuit design and thereafter performing the selecting for substitution.

8. A semiconductor integrated circuit comprising:
   a plurality of gate instances;
   circuit paths defined through respective ones of the gate instances;
   wherein a subset of the gate instances are standard threshold voltage variants substituted in the semiconductor integrated circuit based on at least a maximum of a first set of path cycle times and a maximum of a second set of path cycle times for a corresponding low threshold voltage variant;
   wherein the first set of path cycle times are determined for respective ones of at least a subset of a plurality of the circuit paths, the subset corresponding to individual paths of the plurality of the circuit paths, the individual paths including a particular low threshold variant of a gate instance, a timing difference corresponding to at least one of the individual paths of the subset being a slowdown;
   wherein the second set of Path cycle times are determined for respective ones of the subset of the plurality of the circuit paths, the individual paths including a standard threshold variant corresponding to the particular low threshold variant, thereby removing the timing difference from the individual paths;
   wherein the timing differences corresponding to respective ones of the plurality of the circuit paths, an individual timing difference being between an individual path of the plurality of the circuit paths including a low threshold variant of a gate instance and the individual path including a standard threshold variant of the gate instance, the individual Path including at least one low threshold variant of a gate instance.

9. The semiconductor integrated circuit of claim 8, wherein the timing difference is based on at least an input slew rate for at least one gate instance in at least one individual circuit path.

10. The semiconductor integrated circuit of claim 9, wherein the input slew rate is based at least in part on a falling edge input transition.

11. The semiconductor integrated circuit of claim 8, wherein the timing difference exceeds a threshold.

12. A computer readable encoding of a semiconductor integrated circuit design, the computer readable encoding comprising:
   one or more design file media encoding representations of a plurality of gate instances; and
   one or more design file media encoding representations of circuit paths defined through respective ones of the gate instances,
   wherein a subset of the gate instances are standard threshold voltage variants substituted in the semiconductor integrated circuit based on at least a maximum of a first set of path cycle times and a maximum of a second set of path cycle times for a corresponding low threshold voltage variant;
   wherein the first set of path cycle times are determined for respective ones of at least a subset of a plurality of the circuit paths, the subset corresponding to individual paths of the plurality of the circuit paths, the individual paths including a particular low threshold variant of a gate instance, a timing difference corresponding to at least one of the individual paths of the subset being a slowdown;
   wherein the second set of path cycle times are determined for respective ones of the subset of the plurality of the circuit paths, the individual Paths including a standard threshold variant corresponding to the particular low threshold variant, thereby removing the timing difference from the individual paths;
   wherein the timing differences corresponding to respective ones of the plurality of the circuit paths, an individual timing difference being between an individual path of the plurality of the circuit paths including a low threshold variant of a gate instance and the individual path including a standard threshold variant of the gate instance, the individual path including at least one low threshold variant of a gate instance.

13. The computer readable encoding of a semiconductor integrated circuit design of claim 12, wherein the timing difference is based on at least an input slew rate for at least one gate instance in at least one individual circuit path.

14. The computer readable encoding of a semiconductor integrated circuit design of claim 13, wherein the input slew rate is based at least in part on a falling edge input transition.

15. The computer readable encoding of a semiconductor integrated circuit design of claim 12, wherein the timing difference exceeds a threshold.

16. A method of making a computer readable media product that encodes a design file representation of a semiconductor integrated circuit, the method comprising:
preparing the one or more design files for the semiconductor integrated circuit including at least one low threshold voltage instance and performing timing analysis thereon;
substituting at least one of the low threshold voltage instances of the semiconductor integrated circuit with a standard threshold voltage instance; and
generating one or more design file outputs that encode representations of the semiconductor integrated circuit, including the substituted standard threshold voltage instances; and
supplying the one or more design file outputs as at least part of the computer readable media product;
wherein a subset of the rate instances are standard threshold voltage variants substituted in the semiconductor integrated circuit based on at least a maximum of a first set of path cycle times and a maximum of a second set of path cycle times for a corresponding low threshold voltage variant;
wherein the first set of path cycle times are determined for respective ones of at least a subset of a plurality of paths, the subset corresponding to individual paths of the plurality of paths, the individual paths including a Particular low threshold variant of a Rate instance, a timing difference corresponding to at least one of the individual paths of the subset being a slowdown;
wherein the second set of path cycle times are determined for respective ones of the subset of the plurality of paths, the individual paths including a standard threshold variant corresponding to the particular low threshold variant, thereby removing the timing difference from the individual paths;
wherein the timing differences corresponding to respective ones of the plurality of paths, an individual timing difference being between an individual path of the plurality of paths including a low threshold variant of a gate instance and the individual path including a standard threshold variant of the gate instance, the individual path including at least one low threshold variant of a gate instance.

17. The method of making a computer readable media product that encodes a design file representation of a semiconductor integrated circuit of claim 16, wherein the substituting is based at least in part on an input slew rate for at least one gate instance.

18. The method of making a computer readable media product that encodes a design file representation of a semiconductor integrated circuit of claim 17, wherein the input slew rate is based at least in part on a falling edge input transition.

19. The method of making a computer readable media product that encodes a design file representation of a semiconductor integrated circuit of claim 16, wherein the timing difference exceeds a threshold.

20. An apparatus comprising:
means for processing one or more design files for a semiconductor integrated circuit, the one or more design files, encoding representations of a plurality of gate instances and circuit paths;
means for selecting at least one of the gate instances based on a measurement that indicates a low threshold voltage variant timing penalty; and
means for substituting at least one of the low threshold voltage gate instance representations with respective standard threshold voltage variants thereof;
wherein the at least one of the low threshold voltage gate instance representations is selected based on at least a maximum of a first set of path cycle times and a maximum of a second set of path cycle times for a corresponding low threshold voltage variant:
wherein the first set of path cycle times are determined for respective ones of at least a subset of a plurality of paths, the subset corresponding to individual Paths of the plurality of paths, the individual paths including a particular low threshold variant of a gate instance, a timing difference corresponding to at least one of the individual paths of the subset being a slowdown;
wherein the second set of path cycle times are determined for respective ones of the subset of the plurality of paths, the individual paths including a standard threshold variant corresponding to the particular low threshold variant, thereby removing the timing difference from the path;
wherein the timing differences corresponding to respective ones of the plurality of paths, an individual timing difference being between an individual path of the plurality of paths including a low threshold variant of a gate instance and the individual path including standard threshold variant of the gate instance, the individual path including at least one low threshold variant of a gate instance.

21. The apparatus of claim 20, wherein the timing difference is based on at least an input slew rate of an individual gate instance.

22. The apparatus of claim 21, wherein the input slew rate is based at least in part on a falling edge input transition.

23. The apparatus of claim 21, wherein the timing difference exceeds a threshold.

* * * * *

UNITED STATES PATENT AND TRADEMARK OFFICE
CERTIFICATE OF CORRECTION

PATENT NO. : 7,032,200 B1
APPLICATION NO. : 10/657964
DATED : April 18, 2006
INVENTOR(S) : Sririam Satakopan et al.

It is certified that error appears in the above-identified patent and that said Letters Patent is hereby corrected as shown below:

In column 4, Table 2, replace "Path cycle time without $LV_t$ device penalty" with --Path cycle time without $LV_t$ device--;

In column 7, line 20, replace "rate" with --gate--;
line 29, replace "Particular low threshold variant of a Rate" with --particular low threshold variant of a gate--;

In column 8, line 11, remove the comma after "files".

Signed and Sealed this

Twenty-second Day of August, 2006

JON W. DUDAS
*Director of the United States Patent and Trademark Office*